United States Patent [19]
Chung

[11] Patent Number: 5,798,299
[45] Date of Patent: Aug. 25, 1998

[54] INTERCONNECT STRUCTURES FOR INTEGRATED CIRCUITS

[75] Inventor: Henry Wei-Ming Chung, Cupertino, Calif.

[73] Assignee: National Semiconductor Corporation, Santa Clara, Calif.

[21] Appl. No.: 641,583

[22] Filed: May 1, 1996

Related U.S. Application Data

[60] Continuation of Ser. No. 295,957, Aug. 24, 1994, Pat. No. 5,571,751, which is a division of Ser. No. 240,044, May 9, 1994, abandoned.

[51] Int. Cl.⁶ ............................................. H01L 21/44
[52] U.S. Cl. .................... 438/625; 438/637; 438/688; 438/685; 438/668
[58] Field of Search ............................ 437/187, 195, 437/190, 192, 197, 198; 438/625, 637, 688, 685, 668

[56] References Cited

U.S. PATENT DOCUMENTS

| | | | |
|---|---|---|---|
| 3,323,198 | 6/1967 | Shortes | 29/155.5 |
| 4,410,622 | 10/1983 | Dalal et al. | 430/312 |
| 4,619,037 | 10/1986 | Taguchi et al. | |
| 4,840,923 | 6/1989 | Flagello et al. | 437/189 |
| 4,866,009 | 9/1989 | Matsuda | 437/203 |
| 4,874,719 | 10/1989 | Kurosawa | 437/195 |
| 4,924,295 | 5/1990 | Kuecher | |
| 4,987,099 | 1/1991 | Flanner | 437/192 |
| 5,210,053 | 5/1993 | Yamagata | 437/192 |
| 5,233,224 | 8/1993 | Ikeda et al. | 257/773 |
| 5,306,952 | 4/1994 | Matsuura et al. | 257/165 |
| 5,313,100 | 5/1994 | Ishii et al. | 257/751 |
| 5,313,101 | 5/1994 | Harada et al. | 257/758 |
| 5,358,903 | 10/1994 | Kim | 437/195 |
| 5,360,995 | 11/1994 | Graas | 257/751 |
| 5,393,703 | 2/1995 | Olowolafe et al. | 437/197 |
| 5,439,848 | 8/1995 | Hsu et al. | 437/195 |

FOREIGN PATENT DOCUMENTS

| | | | |
|---|---|---|---|
| 0407133A2 | 1/1991 | European Pat. Off. | |
| 4234666A1 | 10/1992 | Germany | 23/532 |
| 0107539 | 6/1984 | Japan | |
| 63-78552 | 4/1988 | Japan | |
| 0216361 | 9/1988 | Japan | 257/758 |
| 0260054 | 10/1988 | Japan | |
| 1-194334 | 8/1989 | Japan | |
| 0031418 | 2/1990 | Japan | 257/758 |
| 2-192756 | 7/1990 | Japan | |
| 2231742 | 9/1990 | Japan | |
| 4-355951 | 12/1992 | Japan | |
| 6013339 | 1/1994 | Japan | |

OTHER PUBLICATIONS

Ghandhi, S.K. "VLSI Fabrication Principles" (John Wiley & Sons, N.Y.) 1983 pp. 548–550.

Gardner, D.S. "Encapsulated Copper Interconnection Devices Using Sidewall Barriers" pp. 99–108 1991 Proc. 8th International IEEE VLSI Multilevel Interconnect Conf. (Jun. 1991).

(List continued on next page.)

Primary Examiner—Caridad Everhart
Attorney, Agent, or Firm—Skjerven, Morrill, MacPherson, Franklin & Friel, LLP; Kent B. Chambers

[57] ABSTRACT

A multilevel interconnect structure which has a first horizontal metallic conductor disposed on the top of a previously formed first contact/via dielectric where the contact/via dielectric contains a contact/via hole. A horizontal interconnect is deposited over the first contact/via dielectric and has a first surface defined by the thickness and linewidth of the horizontal interconnect. A vertical metallic conductor is deposited in the contact/via hole to form a contact/via plug which extends through the dielectric and contacts the first surface of the horizontal interconnect. The process may be used to form additional levels and to form a plurality of similar horizontal and vertical metallic interconnects.

24 Claims, 13 Drawing Sheets

OTHER PUBLICATIONS

B.K. Liew, P. Fang, N.W. Cheung, and C. Hu; Reliability Simulator For Interconnect and Intermetallic Contact Electromigration; 1990 IEEE/International Reliability Physics Symposium; pp. 111–118.

B.K. Liew, N.W. Cheung, and C. Hu; Electromigration Interconnect Lifetime Under AC and Pulse DC Stress; 1989 IEEE/International Reliability Physics Symposium; pp. 215–219.

Boon–Khim Liew, Nathan W. Cheung, and Chenming Hu; Projecting Interconnect Electromigration Lifetime for Arbitrary Current Waveforms; IEEE Transactions on Electron Devices, vol. 37, No. 5, May 1990; pp. 1343–1351.

Fumitomo Matsuoka, Hiroshi Iwai, Kaoru Hama, Hitoshi Itoh, Renpei Nakata, Tsukasa Nakakubo, Kenji Maeguchi, and Koichi Kanzaki; Electromigration Reliability for a Tungsten–Filled Via Hole Structure; IEEE Transactions on Electron Devices, vol. 37, No. 3, Mar. 1990; pp. 562–568.

K. Weide, W. Hasse; 3–Dimensional Simulations of Temperature and Current Density Distribution in a Via Structure; 1992 IEEE/International Reliability Physics Symposium; pp. 361–365.

Thomas Kwok, Tue Nguyen, Sidney Yip, and Paul Ho; Optimization of Stud and Via Structures for Minimal Current Crowding and Local Heating in Multilevel Interconnection; IEEE/V–MIC Conference, Jun. 15–16, 1987; pp. 252–264.

Yasunori Inoue, et al., "Behavior of TiN and Ti Barrier Metals in Al–Barrier–Al Via Hole Metallization," Journal of the Electrochemical Society, vol. 141, No. 4, Apr. 1994, pp. 1056–1061.

INTERCONNECT STRUCTURES FOR INTEGRATED CIRCUITS

BACKGROUND OF THE INVENTION

This application is a continuation of application Ser. No. 08/295,957, now U.S. Pat. 5,571,751 filed Aug. 25, 1994, which is a division of application Ser. No. 08/240,044, filed May 9, 1994 pending

1. Field of the Invention

This invention relates to interconnect structures for integrated circuits, and more specifically to vertical contact interfaces of interconnect structures.

2. Description of Related Art

The fabrication and connection of multiple electrical devices on a single semiconductor wafer resulted in the advent of integrated circuit ("IC") technology. Early in the development of integrated circuit technology, the interconnect structures of electrical devices typically consisted of a single level of Aluminum metal ("Al") forming a horizontal contact interface with heavily doped diffused regions in the silicon substrate. However, in order to obtain the flexibility needed to interconnect larger numbers of smaller devices and more complex circuits, it became necessary to develop and utilize multi-level interconnect structures.

FIG. 1 illustrates a cross-sectional view of a multi-level interconnect structure 100 fabricated using conventional technology. Multi-level interconnect structure 100 is composed of a contact dielectric 102, an adhesion layer (not shown for clarity), a barrier layer (not shown for clarity) between contact interfaces, tungsten ("W") vertical interconnects 108, 114, and 116, via dielectric 112, horizontal interconnects 110, 118, and 120 (shown extending into the page). During fabrication, deposition and metal masking of horizontal interconnect 110 on the surface of contact dielectric 102 follows the deposition of the W vertical interconnect 108. Because of the planarity of the surface of contact dielectric 102, a horizontal contact interface 109 exists between horizontal interconnect 110 and W vertical interconnect 108. FIG. 16 illustrates a top view of a perfectly aligned conventional horizontal contact interface between a conventional contact/via 402 and a conventional horizontal interconnect 404. Referring now to FIG. 1, the W vertical interconnect 108 provides an electrical conduction path between electrical device 106 and horizontal interconnect 110.

After the fabrication of via dielectric 112, W vertical interconnects 114 and 116 are deposited and serve as electrical conduction paths between subsequently deposited horizontal interconnects 118 and 120, respectively, and horizontal interconnect 110. W vertical interconnects 114 and 116 have horizontal contact interfaces 124 and 126, respectively, with horizontal interconnect 110 due to the surface planarity of horizontal interconnect 110. Additionally, W vertical interconnects 114 and 116 have horizontal contact interfaces 128 and 130, respectively, with horizontal interconnects 118 and 120 due to the surface planarity of via dielectric 112.

Conductors made of thin films of Al or its alloys, such as Al—Cu (i.e. an aluminum and copper alloy) or Al—Cu—Si (i.e. an aluminum, copper, and silicon alloy), are commonly used for horizontal interconnects 110, 118, and 120. Deposition of a barrier layer underneath horizontal interconnects 110, 118, and 120 (not shown for clarity) is typically included to enhance the electromigration resistance of horizontal interconnect 110. The barrier layer is typically composed of Ti—W (i.e. Titanium and Tungsten alloy) or Ti/TiN$_x$ (i.e. Titanium underlaying a Titanium and Nitrogen compound with different acceptable proportions of Nitrogen).

In order to achieve higher device packing density, conventional multi-level interconnect structure fabrication technologies rely in part on the reduction of horizontal interconnect linewidths. Referring now to FIG. 16, although horizontal interconnect linewidths, w, continue to decrease in the conventional architecture, the thicknesses of horizontal interconnects 110, 118, and 120, $t_1$, $t_2$, and $t_3$, respectively, as shown in FIG. 1, remain generally the same. In FIG. 16, the linewidth dimension of horizontal interconnect 404 is comparable to the linewidths of horizontal interconnects 110, 118, and 120. The conventional multi-level interconnect structure 100 is fabricated so that the diameter of the horizontal contact interface 109 is ideally the same as the linewidth of the horizontal interconnect 110. FIG. 16 illustrates this from a top view showing the linewidth of the conventional horizontal interconnect 404 is ideally equal to the diameter of the conventional contact/via hole 402. Referring again to FIG. 1, because of the close dimensional relationship between the size of the horizontal contact interface 109 and the linewidth of the horizontal interconnect 110, the linewidth of the horizontal interconnect 110 determines the maximum size of the horizontal contact interface 109. Likewise, the linewidths of horizontal interconnects 110 and 118 determine the size of horizontal contact interfaces 124 and 128, respectively. Similarly, the linewidths of horizontal interconnects 110 and 120 determine the size of horizontal contact interfaces 126 and 130, respectively. The maximum size of the contact interface in the conventional multi-level interconnect structure 100 is given approximately by Equation (1) as follows:

$$A_{hci} = \pi \ast w^2 / 4 \quad [1]$$

where $A_{hci}$ and w are the size of a horizontal contact interface and the linewidth of a horizontal interconnect, respectively, and π is approximately 3.14. The significance of Equation [1] is presented below.

The conventional multi-level interconnect structure 100 offers high device packing density. An even higher packing density can be achieved by preventing unnecessary overlap by the horizontal interconnects and their respective contact/via holes. However, as shown in FIG. 16, due to finite tolerances in the fabrication process some overlap 406 (as illustrated by the dashed lines) of the conventional horizontal interconnect 404 with the contact/via hole 402 and its associated horizontal contact/via interface may occur. Therefore, in FIG. 1, horizontal interconnects 110, 118, and 120 overlap the respective vertical interconnects 108, 114, and 116. However, the magnitude of the overlap may be affected by the types of materials used for the horizontal and vertical interconnects. When both horizontal and vertical interconnects are fabricated from the same kinds of thin films, it is a non-trivial task to prevent unnecessary overlapping of the vertical interconnects 108, 114, and 116. However, by using different thin films for the horizontal and vertical interconnects which have different plasma etch characteristics, prevention of unnecessary overlap can be achieved. The plasma etch characteristics of W are different from those of Al, and a high plasma etch selectivity can be obtained i.e. the W etch rate is significantly lower than the Al etch rate. Therefore, it is typical to fabricate the horizontal and vertical interconnect structures from different materials.

While the conventional multi-level interconnect structure 100 offers high device packing density, it exhibits significant disadvantages. A first disadvantage relates to electromigration failures occurring at the horizontal contact interfaces between the W vertical interconnects 108, 114, and 116 and the horizontal interconnects 110, 118, and 120. Electromigration is the motion of conductor ions (such as Al) in response to the passage of current through the conductor. The conductor ions move "downstream" by the force of the "electron current." A positive divergence of the ionic flux leads to an accumulation of vacancies, forming a void(s) in the metal. Electromigration presents significant reliability and performance issues in that as the size and/or number of voids form, reduction in the current carrying capability of the conductor results. Because speed performance is often directly related to current carrying ability, electromigration consequentially results in the degradation of the speed performance of an integrated circuit incorporating such conductors. Furthermore, a void due to electromigration may ultimately grow to a size that results in a catastrophic open circuit failure of an affected conductor.

The contact interface between dissimilar conductors is more prone to electromigration than in each conductor alone. For example, the contact interface between W and Al is more prone to electromigration than in W and Al alone. As a result, the electromigration lifetime of the contact interface becomes the limiting factor on design-rule current density i.e. the amount of current per unit area designed to be carried by a conductor.

The electromigration lifetime (i.e. the amount of elapsed time prior to the failure of the conductor) can be approximated by Equation [2] as follows:

$$t_{em} = K * \exp[(E_a/kT)] * (1/J)^n \quad [2]$$

where $t_{em}$ is the electromigration lifetime, K is a constant, $E_a$ is the activation energy, k is Boltzmann's constant, T is the operating temperature in Kelvin, J is the current density, and n is a current-density dependent exponent greater than or equal to 2. Equation [2] infers that, for a given multi-level interconnect system and operating temperature, electromigration lifetime decreases with increasing current density.

The current density J is directly related to current I and the size of a contact interface A as expressed by Equation [3] as follows:

$$J = I/A \quad [3]$$

Equation [3] infers that, for a given current, the current density at the contact interface increases as the size of the contact interface decreases. Therefore, in accordance with Equations [1], [2], and [3] electromigration lifetime decreases as the size of the contact interface decreases, and the size of the contact interface decreases as linewidth decreases. Similarly, decreases in the size of the contact interface increases the rate of degradation of the contact interface due to electromigration which in turn results in the degradation of integrated circuit speed performance.

Conventional multi-level interconnect structure fabrication technologies rely in part on the reduction of interconnect linewidths to achieve even higher device packing densities. As evident from Equation [1] and the dimensional relationship between horizontal contact interfaces and horizontal interconnect linewidths, decreases in linewidth result in parabolic decreases in the size of the contact interface. For a conventional multi-level interconnect structure to achieve higher device packing densities by decreasing the size of the contact interface, costly tradeoffs in reliability and/or integrated circuit speed performance arise. In the conventional multi-level interconnect structure, reliability tradeoffs occur when linewidths are decreased and speed performance and, thus, current density are sought to be maintained because of decreases in the electromigration lifetime of the contact interface result. Additionally, in the conventional multi-level interconnect structure, integrated circuit speed performance tradeoffs occur when electromigration lifetime is maintained by reducing the current density because a decrease in integrated speed performance results. However, neither tradeoffs in reliability nor integrated circuit speed performance are desirable.

Referring to FIG. 17, another disadvantage involves the misalignment of a conventional contact/via hole 402 and conventional horizontal interconnect 404. If there is misalignment between the contact/via hole 402 and the horizontal interconnect 404, the size of the contact interface 408, i.e. the overlapping region, reduces in accordance with Equation [1]. For the same reasons discussed above, depending on the magnitude of the contact interface size reduction, the decreased size of horizontal contact interface 408 can seriously degrade the electromigration lifetime of the horizontal contact interface 408. Referring back to FIG. 1, misalignment of the horizontal contact interfaces 109, 124, 126, 128, and 130 can result in significant degradation of the electromigration lifetime of the respective misaligned horizontal contact interfaces.

SUMMARY OF THE INVENTION

The importance of fabricating reliable interconnect structures without compromising circuit performance cannot be overstated. The interconnect structure of the present invention has the advantages of enhancing integrated circuit speed performance without compromise on reliability and enhancing reliability without compromise on integrated circuit speed performance. The present invention also provides a self-aligning vertical interconnect structure in the direction of the horizontal interconnect structure. One embodiment of the present invention is an integrated circuit having an interconnect structure which has a horizontal metallic conductor and a vertical metallic conductor. The interface between the horizontal metallic conductor and the vertical metallic conductor extends beyond the generally planar surface of the horizontal conductor. In one embodiment, the horizontal metallic conductor has a thickness and a width and the contact interface between the vertical and horizontal metallic conductors is defined by the thickness and width of the horizontal metallic conductor.

In another embodiment, the present invention is a process for forming a metallic interconnect structure in an integrated circuit where a first dielectric layer is formed and a first metallic layer is deposited. A mask is formed having an opening to the first metallic layer and an opening is formed in the first metallic layer by etching through the mask. An opening is formed in the first dielectric layer by etching through the first metallic layer. A second metallic layer is deposited to fill the opening in the first metallic layer and the opening in the first dielectric layer. The first metallic layer is patterned to form a horizontal interconnect.

In an alternative embodiment the present invention is a process for forming a metallic interconnect structure in an integrated circuit where a dielectric layer is formed and a sacrificial layer is formed on the dielectric layer. A mask is formed having an opening to the sacrificial layer and an opening is formed in the sacrificial layer by etching through the mask. An opening is formed in the dielectric layer by etching through the sacrificial layer. A first metallic layer is deposited to fill the opening in the sacrificial layer and the opening in the dielectric layer. The sacrificial layer is removed, thus exposing a portion of the first metallic layer filling the opening in the sacrificial layer. A second metallic layer is deposited over the exposed first metallic layer and the dielectric layer. The second metallic layer is patterned to form a horizontal interconnect.

In another alternative embodiment, the present invention is a process for forming a metallic interconnect structure in an integrated circuit where a first dielectric layer is formed. A mask is formed having an opening to the first dielectric layer. The dielectric layer is etched through the mask to form an opening in the dielectric layer to a first depth. A first metallic layer is deposited to fill the opening in the dielectric layer. A portion of the dielectric is removed to a second depth, the second depth being less than the first depth. Following the removal of the dielectric portion to a second depth, a second metallic layer is deposited over the dielectric layer wherein a contact is formed between the first and second metallic layers. The second metallic layer is patterned to form a horizontal interconnect.

BRIEF DESCRIPTION OF THE DRAWINGS

Reference numerals referring to the same feature appearing in multiple figures are the same.

DETAILED DESCRIPTION OF THE PREFERRED EMBODIMENTS

Figure 2:
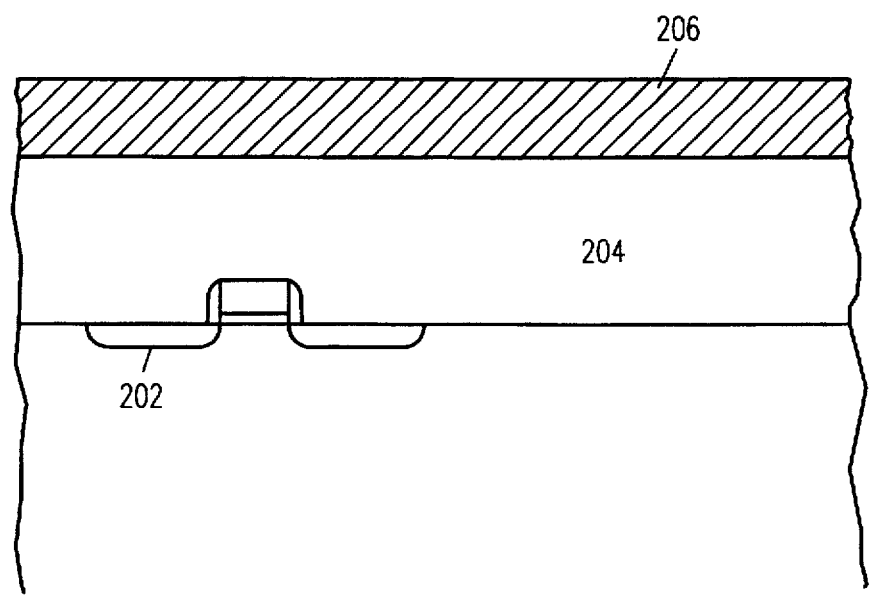
FIGS. 2 through 10 illustrate cross sectional representations of a portion of a semiconductor wafer at successive steps in a process for fabricating a multi-level interconnect structure.

FIG. 2 illustrates the portion of a semiconductor wafer composed of a previously fabricated electrical device 202 and contact dielectric 204. Following the preliminary fabrication of the contact dielectric 204, a suitable initial point from which to begin fabrication of the multi-level interconnect structure is provided. Other preliminary fabrication processes may also take advantage of the multi-level interconnect structure fabricated by the process described herein.

Initially, horizontal metallic layer 206 composed of, for example, a multiple layered Ti/TiN$_x$/Al—Cu/TiN$_x$ stack is deposited on the surface of contact dielectric 204 as shown in FIG. 2. Other suitable conductors may be used to fabricate horizontal metallic layer 206. For example, the TiN$_x$ in the Ti/TiN$_x$/Al—Cu/TiN$_x$ stack can be replaced with TiW, and the Al—Cu can be replaced with Al—Si—Cu or other Al alloys. Additionally, Cu or Cu—based alloys can be used to fabricate the horizontal metallic layer 206. Note that horizontal metallic layer 206 is deposited prior to the creation of a contact hole or via.

Figure 3:
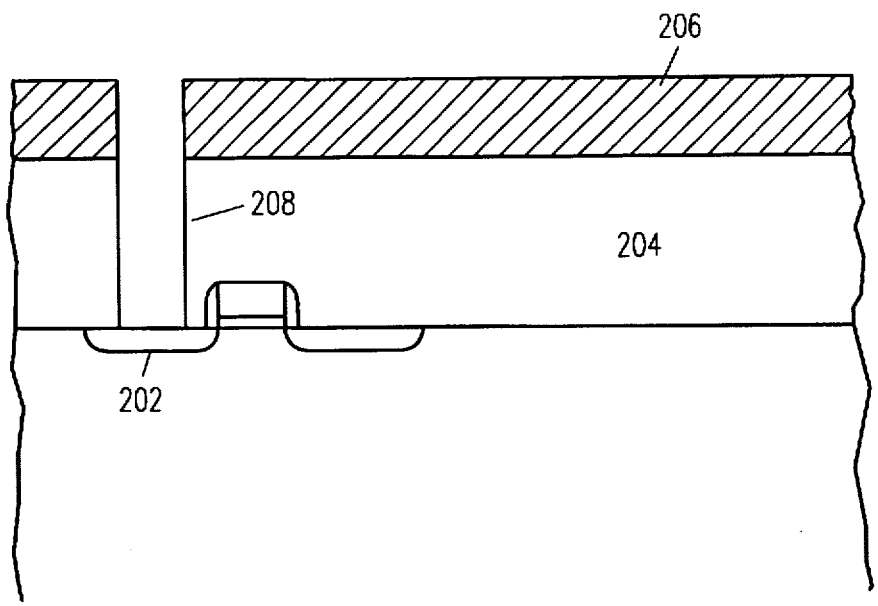

Next, a photoresist mask (not shown) is applied to horizontal metallic layer 206 and patterned in accordance with conventional technology. The developed photoresist defines the location of contact hole 208 as shown in FIG. 3. Using a chlorine based plasma etch, the unprotected horizontal metallic layer 206 layer is etched anisotropically. A fluorine based plasma etch follows which anisotropically removes the exposed contact dielectric 204 to form contact hole 208. The chlorine based plasma etch is accomplished using an Applied Materials 8330 manufactured by Applied Materials, Inc., a Santa Clara, Calif. company, with Cl$_2$ and BCl$_3$ at room temperature and 25 mTorr. The etching time is determined using an Applied Materials end point detector. The fluorine based plasma etch is accomplished using a Lam Research 4500, manufactured by Lam Research Corp., a Fremont, Calif. company, with CF$_4$, O$_2$, and CHF$_3$ at room temperature and 800 mTorr. The etching time being dependent on the dielectric thickness. In addition, a variety of etch processes well known to those of ordinary skill in the art may be used. It will be appreciated that alternatively horizontal metallic layer 206 and contact dielectric 204 may be etched by a variety of processes well known to those of ordinary skill in the art to achieve a variety of sidewall profiles.

Figure 4:
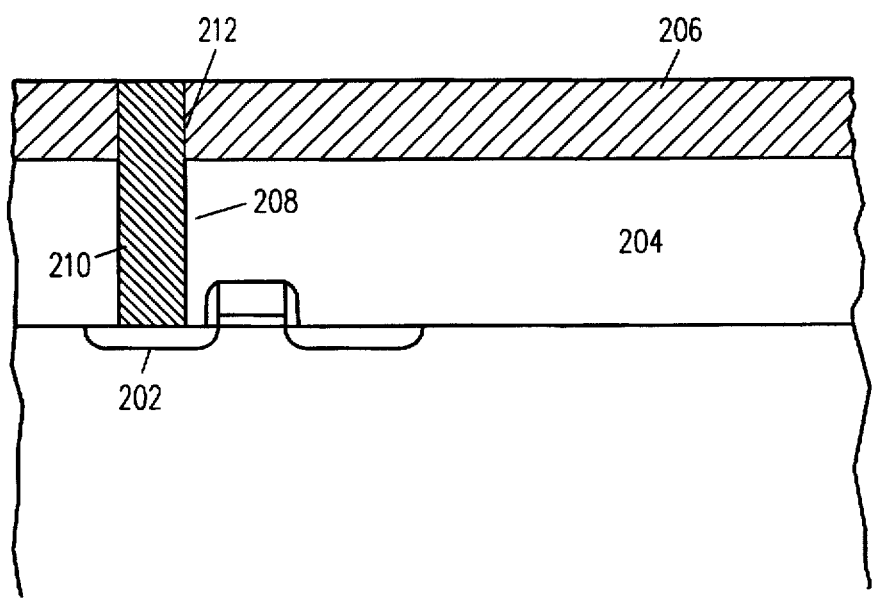

Following the formation of contact hole 208, the process of filling contact hole 208, as shown in FIG. 4, begins by lining contact hole 208 with deposited Ti/TiN (Titanium underneath a Titanium Nitride) stack (not shown for clarity) or layers of other material(s) that adhere well to contact dielectric and W. Titanium, which directly contacts the silicon at the bottom of contact hole 208 facilitates a low contact resistance. The Ti/TiN lining is formed by sputter deposition using a Varian M2000 manufactured by Varian Associates, Inc. a Palo Alto, Calif. company, at 1–20 mTorr at 400° C. The process time depending on the thickness desired. Alternatively, the lining may be formed using an Applied Materials Endura 5000 or an MRC Eclipse manufactured by Materials Research Corp., an Orangeburg, N.Y. company. Titanium nitride can alternatively be deposited by chemical vapor deposition. The contact hole 208 is filled by the chemical vapor deposition ("CVD") of W using an Applied Materials Tungsten Chemical Vapor Deposition system with WF$_6$ and SH$_4$ at 450° C. and 80 Torr. The process time depending on the thickness desired. In addition, a variety of sputter deposition and CVD W processes well known to those of ordinary skill in the art may be used. The W and adhesion layers serve as a vertical interconnect 210 providing an electrical conduction path between electrical device 202 and horizontal metallic layer 206. Vertical interconnect 210 may be referred to as a "contact plug" or "plug". Note that a vertical contact interface 212 exists between the vertical interconnect 210 and horizontal metallic layer 206.

Adhesion layers are typically deposited due to the poor adhesion of W to insulators such as Borophosphosilicate glass, thermal oxide, plasma-enhanced oxide, and silicon nitride. CVD W also has poor adhesion to silicon oxide, commonly used as inter-level dielectric. The adhesion layer may be a thin film which adheres well to both a contact/via hole and a vertical interconnect such as contact hole 208 and W vertical interconnect 210, therefore promoting the adhesion of the contact/via hole to the contact dielectric. The thin film is usually metallic to insure that the bottom of the contact/via holes conduct current. Titanium thin film may be used as the adhesion layer due to its adhesion qualities with respect to both silicon oxide and CVD W. However, Ti is incompatible with a W CVD process in which $WF_6$ is used due to the instability of Ti in the presence of $WF_6$ i.e. Ti reacts with $WF_6$. Therefore, an additional layer such as Titanium Nitride or TiW alloy, with W as the major alloy element, is deposited. Completion of the filling process continues by using blanket chemical vapor deposited W to completely fill the remaining cavity of contact hole 208 as shown in FIG. 4. The W metallic layer deposited on top of horizontal metallic layer 206 is removed using a fluorine or chlorine based plasma etch although other removal methods such as chemical mechanical polishing process may be used. The fluorine based plasma etch is accomplished using an AMT 5000WE, manufactured by Applied Materials Inc., with $Cl_2$, $SF_6$, Ar, and He at room temperature and 200 mTorr. The etching time is determined using an Applied Materials end point detector. In addition, a variety of etching processes well known to those of ordinary skill in the art may be used. It should be noted that in an alternative process step, use of selective chemical vapor deposition can successfully fill contact hole 208 possibly eliminating the need for both a liner film and the removal of W on top of horizontal metallic layer 206.

Figure 5:
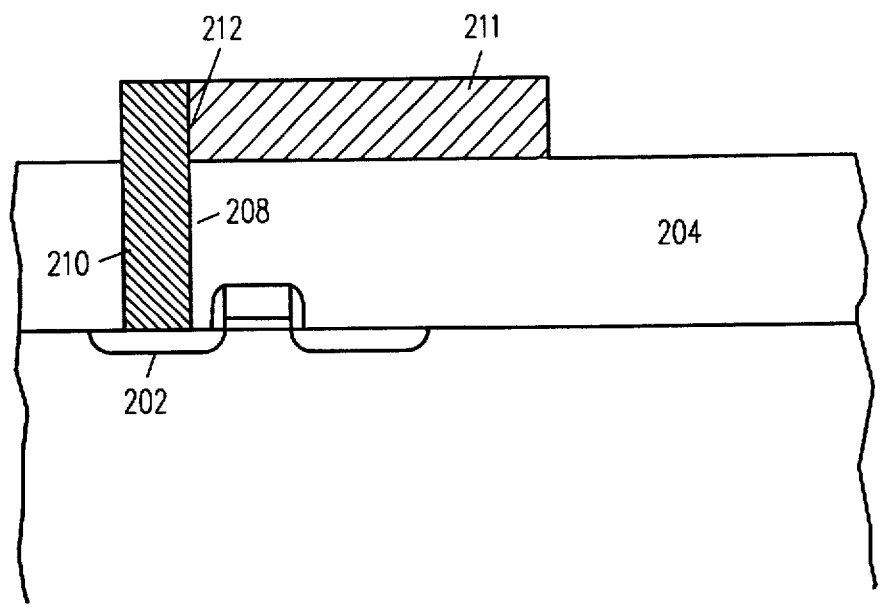

Application and patterning of a photoresist mask (not shown) using conventional technology to horizontal metallic layer 206 in FIG. 4 and subsequent etching of the unprotected horizontal metallic layer 206 results in the interconnect structure shown in FIG. 5. Note that vertical interconnect 210 now terminates horizontal metallic interconnect 211. W vertical interconnects can be exposed during etching due to a high Al to W selectivity of the etching process.

Figure 6:
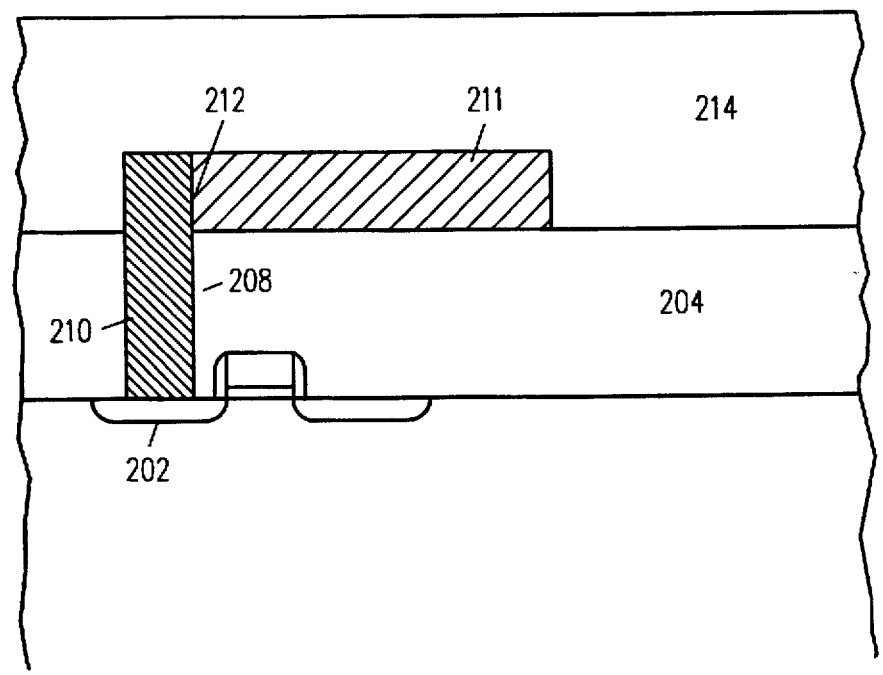

Referring now to FIG. 6, next a via dielectric is deposited on the exposed surfaces of contact dielectric 204, horizontal interconnect 211, and vertical interconnect 210. The deposition of via dielectric 214 is accomplished by first depositing a layer of Tetraethylorthosilicate ("TEOS")—based silicon oxide. The TEOS-based silicon oxide is deposited in an Applied Materials 5000 dielectric system with TEOS and oxygen at 400° C. at a pressure of 10 Torr. The time of deposition is determined by the thickness desired. A siloxane-based spin-on-glass ("SOG") manufactured by Allied Signal, Inc.—Advanced Microelectronic Materials, a Santa Clara, Calif. based company, is then spun on the wafers using a spin-on-glass coater manufactured by Silicon Valley Group, Inc., a San Jose, Calif. based company. A SOG etchback process is then performed in a Lam Research Lam 4500 dielectric etcher using $CF_4$, $CHF_3$, and Ar at room temperature at a pressure of 700 mTorr. After the completion of the SOG etchback, the SOG is cured at 400° C. in oxygen. A layer of TEOS-based silicon oxide is again deposited in an Applied Materials 5000 dielectric system to protect the SOG and provide the desired via dielectric thickness. Via dielectric 214 and contact dielectric 204 are non-conductive and attempt to prevent undesirable electrical conduction paths.

Figure 7:
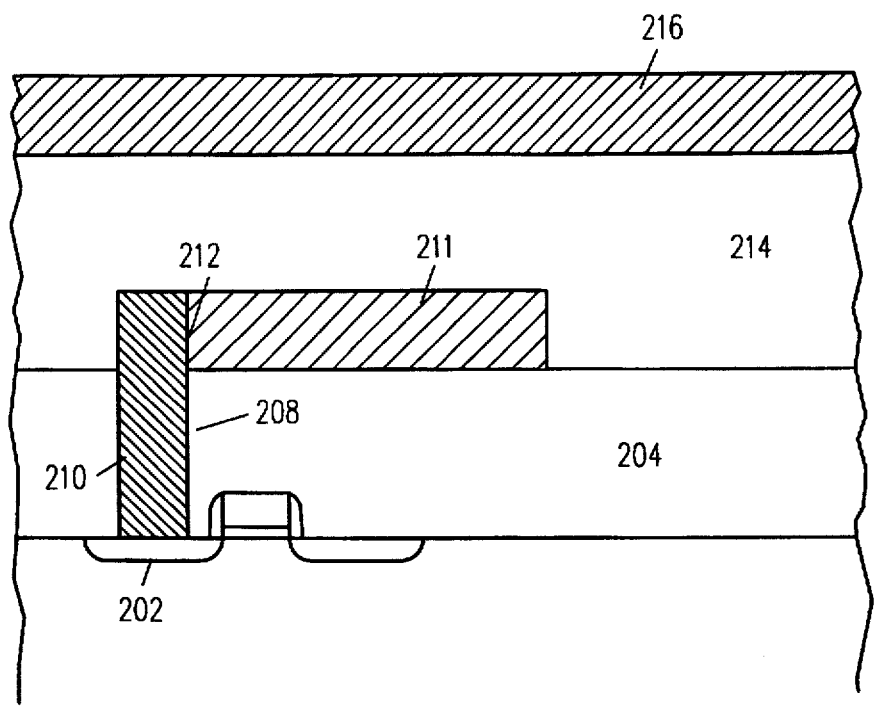

Referring to FIG. 7, horizontal metallic layer 216 is deposited on the surface of via dielectric 214. Similar to horizontal metallic layer 206, horizontal metallic layer 216 consists of a multiple layered $Ti/TiN_x/Al$—$Cu/TiN_x$ stack although other suitable conductors may be used. However, dissimilar conductors may be used. Note that in the horizontal metallic layer 216 deposition step, horizontal metallic layer 216 is deposited prior to the creation of a via.

Figure 8:
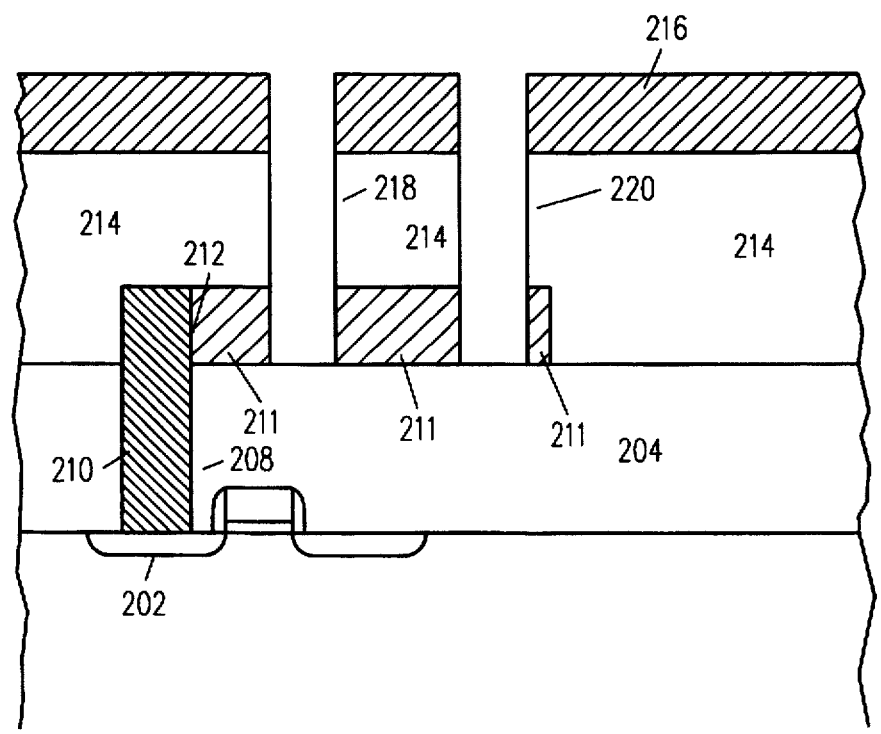

Referring to FIG. 8, next a photoresist mask (not shown) is applied and patterned in accordance with conventional technology to horizontal metallic layer 216 in FIG. 7 which defines the location of via holes-218 and 220. Using a chlorine based plasma etch, removal of the exposed horizontal metallic layer 216 layer is first accomplished, anisotropically. A fluorine based plasma etch follows which anisotropically removes the exposed via dielectric 214. Next, a chlorine based plasma etch follows which anisotropically removes the exposed portions of horizontal interconnect 211 to form via holes 218 and 220. The chlorine and fluorine based etch processes may be the same as those used in conjunction with the etching of horizontal interconnect 211 and contact dielectric 204 to form contact hole 208. It will be appreciated that horizontal metallic layer, via dielectric 214, and horizontal interconnect 211 may be isotropically etched by an etching process well known to those of ordinary skill in the art to form isotropic via holes 218 and 220.

Figure 9:
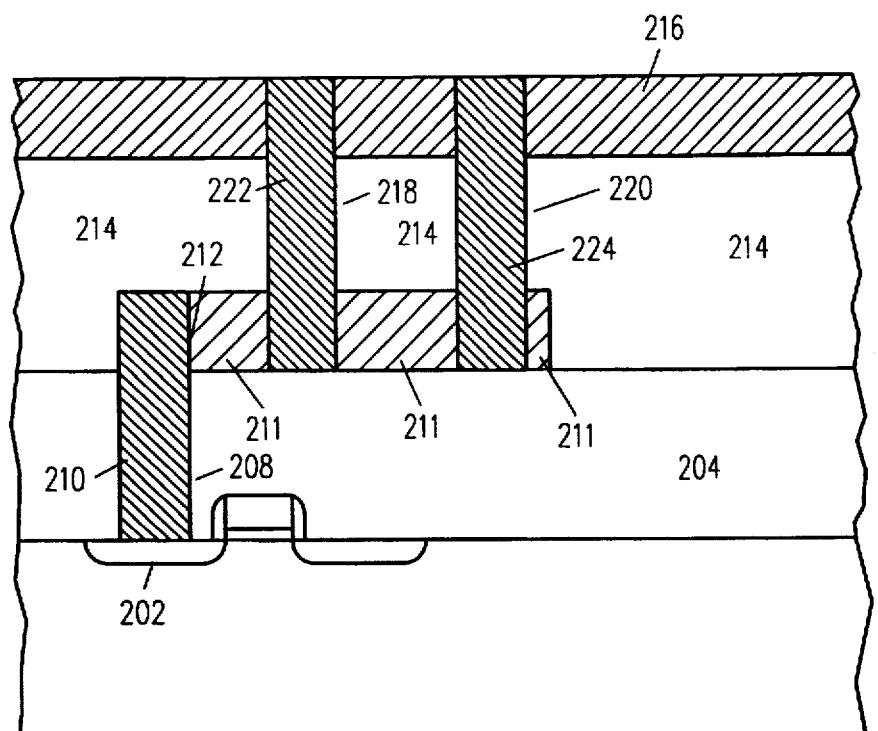

Referring now to FIG. 9, following the formation of via holes 218 and 220, the process of filling via holes 218 and 220 begins by lining via holes 218 and 220 with deposited Ti/TiN (Titanium underneath a Titanium Nitride) stack (not shown for clarity) or layers of other material(s) that adhere well to via dielectric and W. Completion of the filling process continues by using chemical vapor deposited W to completely fill the remaining cavities of via holes 218 and 220 as shown in FIG. 9. The W metallic layer deposited on top of horizontal metallic layer 216 is removed using a plasma etch process described with reference to removal of W deposited on top of horizontal interconnect 206 although other removal methods such as chemical mechanical polishing process may be used. The W in via holes 218 and 220 serve as vertical interconnects 222 and 224 which intrude into horizontal interconnect 211 providing an electrical conduction path between horizontal interconnect 211 and horizontal metallic layer 216. Vertical interconnects 222 and 224 may be referred to individually as a "via", "via plug", or "plug".

Figure 10:
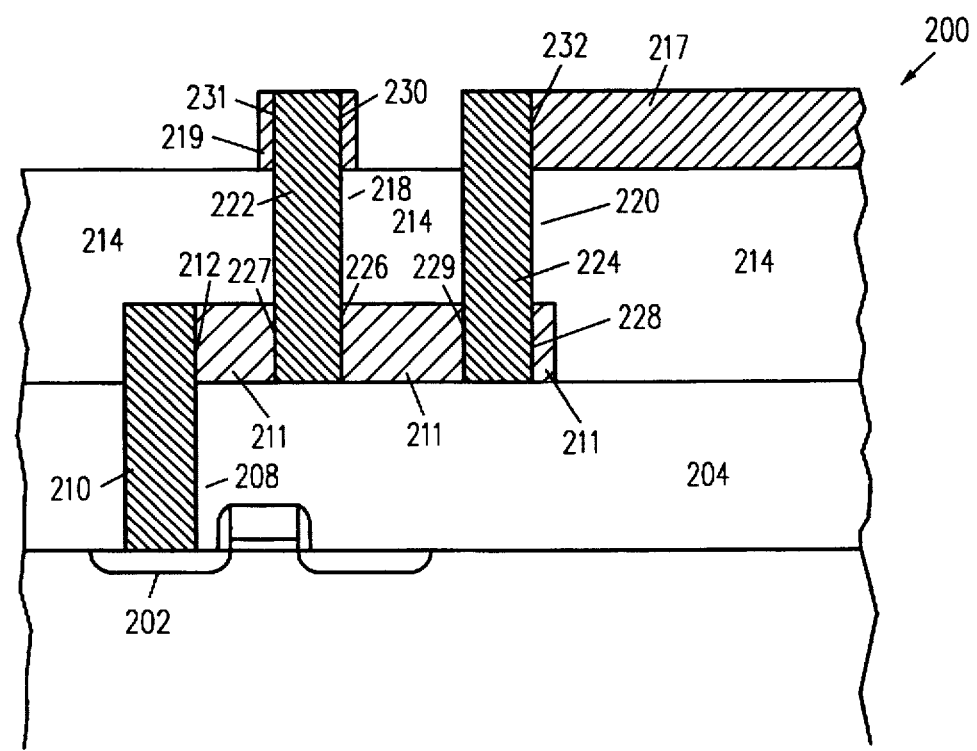
Figure 23:
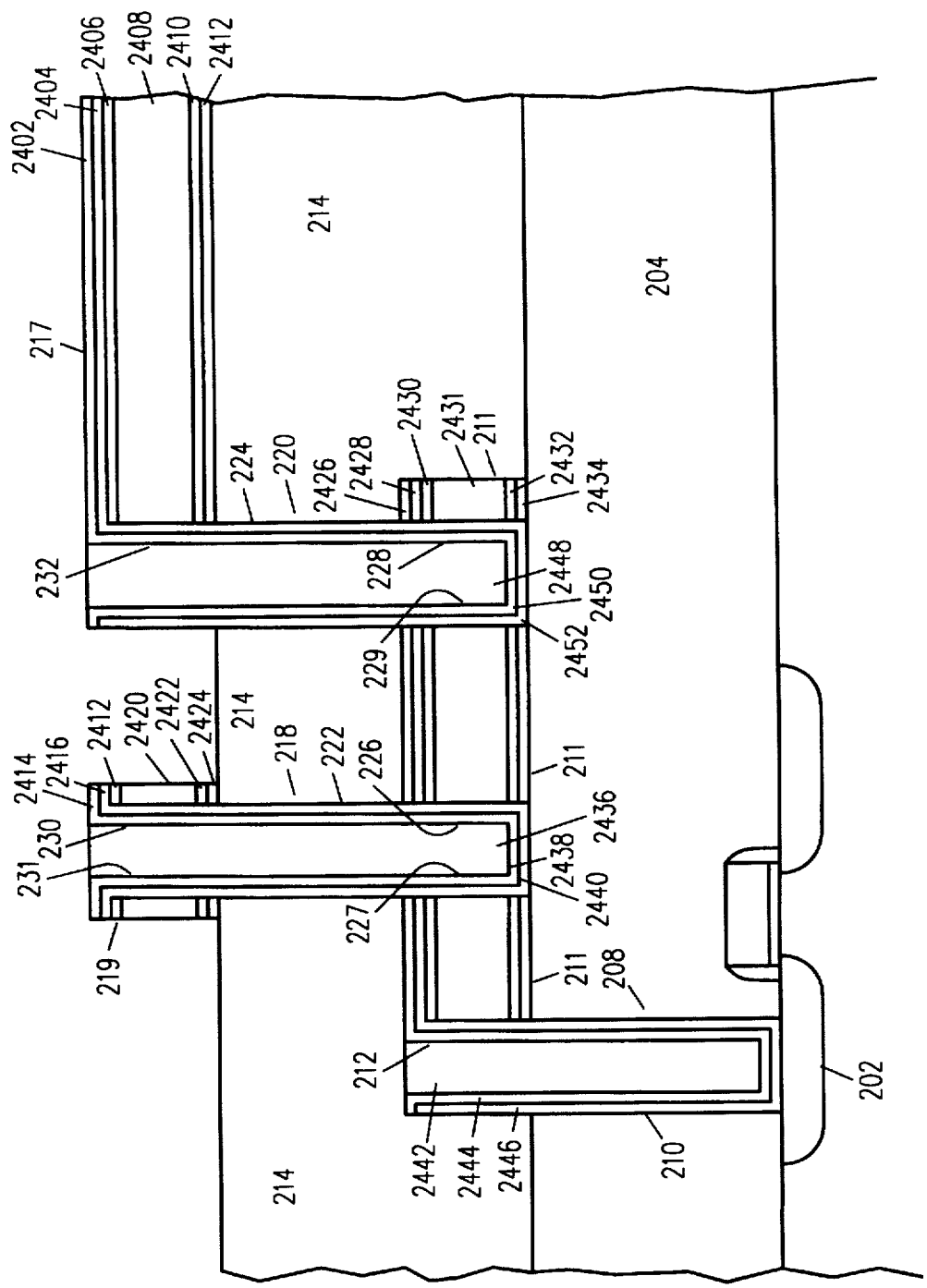
FIG. 23 illustrates the multi-level interconnect structure of FIG. 10 having multi-layered horizontal and vertical interconnects.

Application and patterning of a photoresist mask (not shown) using conventional technology to horizontal metallic layer 216 in FIG. 9 and subsequent clorine based plasma etching of the unprotected areas results in the formation of horizontal interconnects 217 and 219 of multi-level interconnect structure 200 shown in FIG. 10. Note, the dimensions of the horizontal interconnects 211, 217, and 219 and vertical interconnects 210, 220, and 222 may vary in accordance with design criteria. The chlorine based plasma etch process used in conjunction with the etching of horizontal interconnect 211 and horizontal metallic layer 216 to form via holes 218 and 220 and contact hole 208 may also be used here. The multi-level interconnect structure 200 fabrication process completes with the deposition of a dielectric layer (not shown) on the exposed surfaces of via dielectric 214, horizontal interconnects 217 and 219, and vertical interconnects 222 and 224. Note that in accordance with the multi-level interconnect structure, vertical contact interfaces 226, 227, 228, and 229 exist between the W vertical interconnects 222 and 224 and horizontal interconnect 211. Additionally, vertical contact interfaces 230 and 231 exist between vertical interconnect 222 and horizontal interconnect 219, and a vertical contact interface 232 exists between vertical interconnect 224 and horizontal interconnect 217. FIG. 23 illustrates the multi-level interconnect structure of FIG. 10 having multi-layered horizontal and vertical interconnects. Horizontal interconnect 211 includes layers of TiNx 2426, Ti 2428, TiNx 2430, AlCu 2431, TiNx 2432, and Ti 2434. Horizontal interconnect 217 includes layers of TiNx 2402, Ti 2404, TiNx 2406, AlCu 2408, TiNx 2410, and Ti 2412. Horizontal interconnect 219 includes layers of TiNx 2414, Ti 2416, TiNx 2418, AlCu 2420, TiNx 2422, and Ti 2424. Vertical interconnect 210 includes layers of W 2442, TiNx 2444, and Ti 2446. Vertical interconnect 220 includes layers of W 2448, TiNx 2450, and Ti 2452. Vertical interconnect 222 includes layers of W 2436, TiNx 2438, and Ti 2440.

Figure 11:
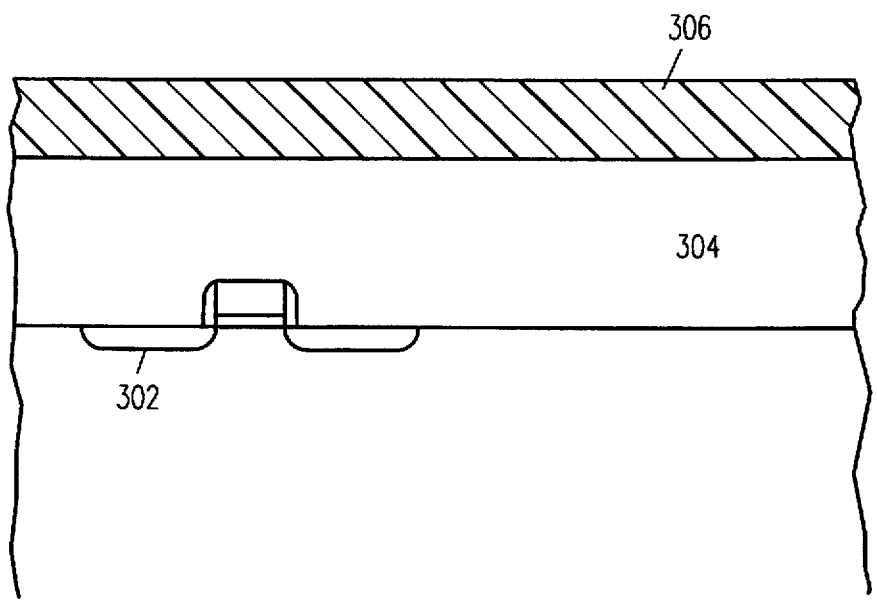
FIGS. 11 through 15 illustrate a cross sectional representation of an alternative process which may be substituted for the process steps illustrated in FIGS. 2 through 4.
Figure 15:
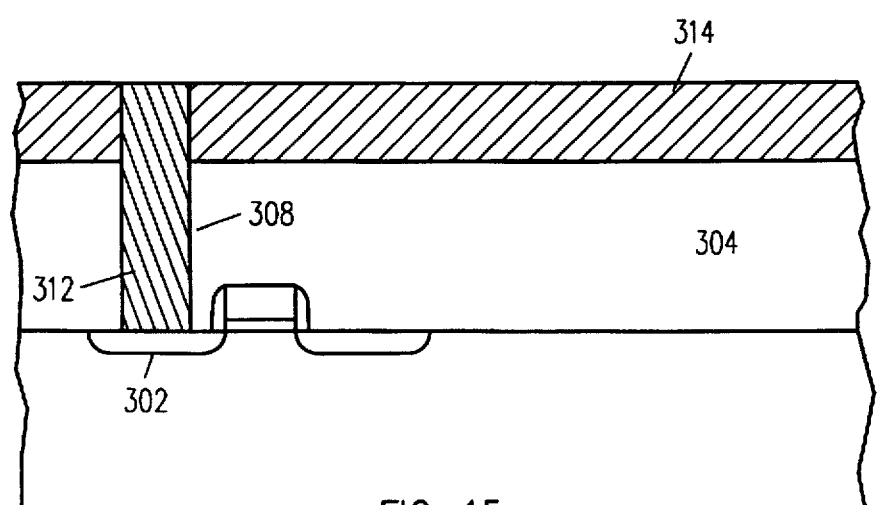

Referring to FIG. 11, in another embodiment, following the preliminary fabrication of device 302 and contact dielectric 304 in a portion of a semiconductor wafer, a silicon nitride sacrificial layer 306 with the same thickness of horizontal metallic layer 314 of FIG. 15 is deposited. Utilization of plasma enhanced chemical vapor deposition technology produces an effective layer 306 of silicon nitride. The deposition of the silicon nitride is accomplished using an Applied Materials AMT5000 with $N_2$ and $SH_4$ at 400° C. and 5 Torr. The deposition time being dependent on the thickness desired. Alternatively, a variety of other deposition processes well known to those of ordinary skill in the art may be used. An alternative to an effective layer 306 of silicon nitride is an effective layer 306 of silicon-rich oxide which has different plasma etch characteristics than silicon oxide. Rather than applying a silicon nitride layer 306, the thickness of the contact dielectric 304 may be increased by an amount equal to the thickness of the horizontal metallic layer 314 in FIG. 15.

Figure 12:
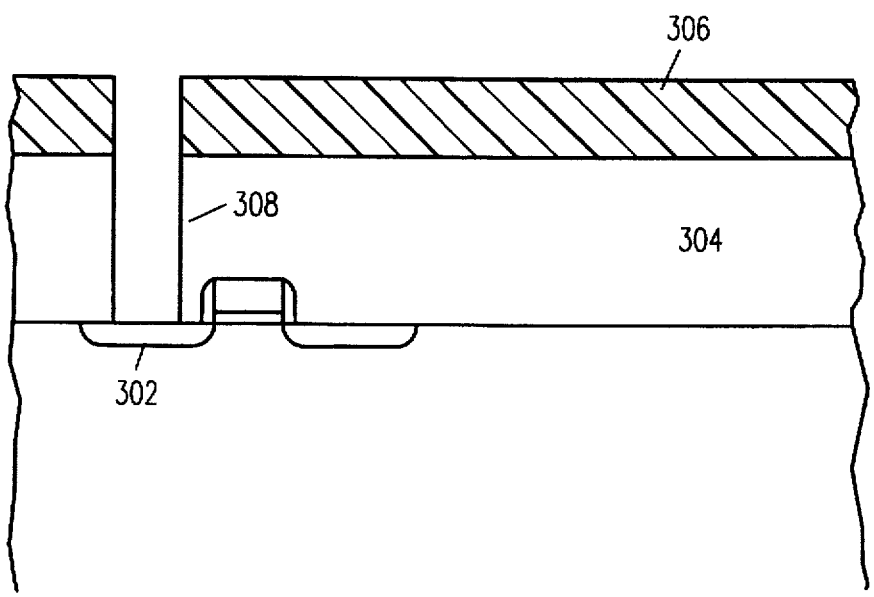
Figure 13:
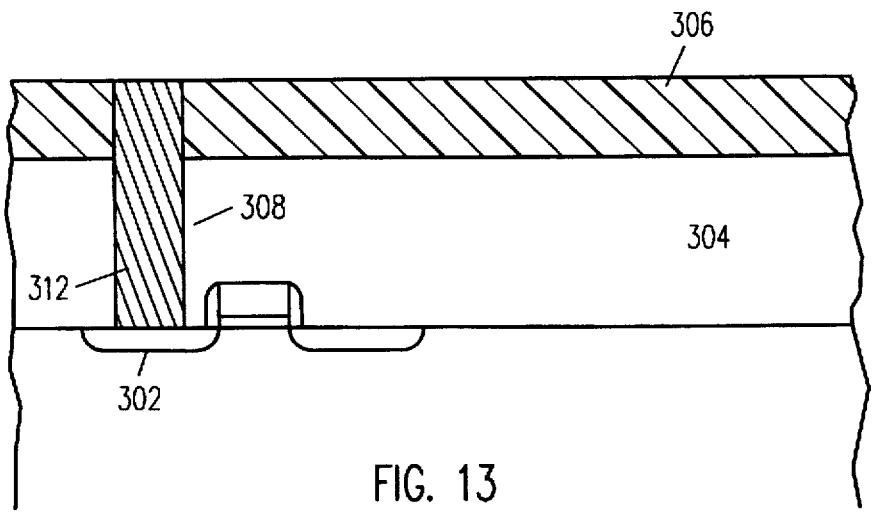

Subsequently, a photoresist mask is applied using conventional technology to silicon nitride layer 306 in FIG. 11 and patterned, followed by a plasma etch of the exposed areas to define contact hole 308 as shown in FIG. 12. As in FIG. 4, contact hole 308 is lined with an adhesion layer followed by the chemical vapor deposition of W to form a vertical interconnect 312 as shown in FIG. 13. The W metallic layer on top of contact dielectric 304 is then removed using plasma etch or chemical mechanical polishing technologies.

Figure 14:
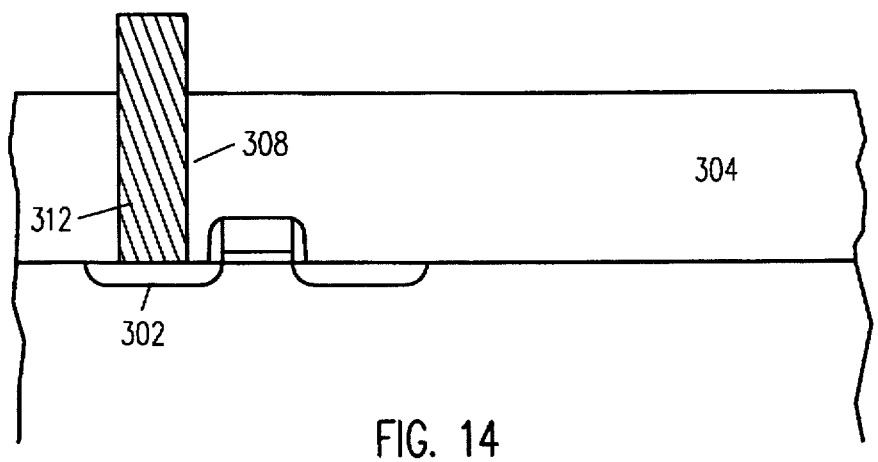

Referring to FIG. 14, selective removal of the silicon nitride sacrificial layer 306 is performed next, resulting in the structure shown in FIG. 14. Note that if the contact dielectric 304 was thickened as mentioned in conjunction with FIG. 11, the structure shown in FIG. 14 may be obtained by using a fluorine based plasma enhanced timed etch to etch the excess contact dielectric 304. The fluorine based plasma enhanced timed etch is accomplished using a Lam Research 4500, $CHF_3$ and $CF_4$, at room temperature and 800 mTorr. The etching time being dependent on the excess thickness of contact dielectric 304.

Referring to FIG. 15, in the ensuing step, horizontal metallic layer 314 is deposited, using the process and materials described in connection with the fabrication of horizontal metallic layer 206, over contact dielectric 304 and vertical interconnect 312. Using a chlorine based plasma etch, the unprotected horizontal metallic layer 314 is etched anisotropically to remove horizontal metallic layer 314 from above vertical interconnect 312 to obtain the structure of FIG. 15. Other processes may be used to remove selected portions of horizontal metallic layer 314 such as a plasma etch. Following the application of a photoresist mask and subsequent etching of the unprotected areas of horizontal interconnect 314, the structure of FIG. 5 is obtained. The process may be continued as described above beginning with the deposition of via dielectric 214 in FIG. 6. Alternatively, the process may be continued substantially as described with reference to FIGS. 11–15 to form a second level interconnect.

It will be appreciated that an interconnect structure which utilizes buried horizontal interconnects, i.e. interconnects formed in trenches, may also be fabricated to form the contact interfaces defined by a thickness and width of the horizontal interconnect.

Figure 1:
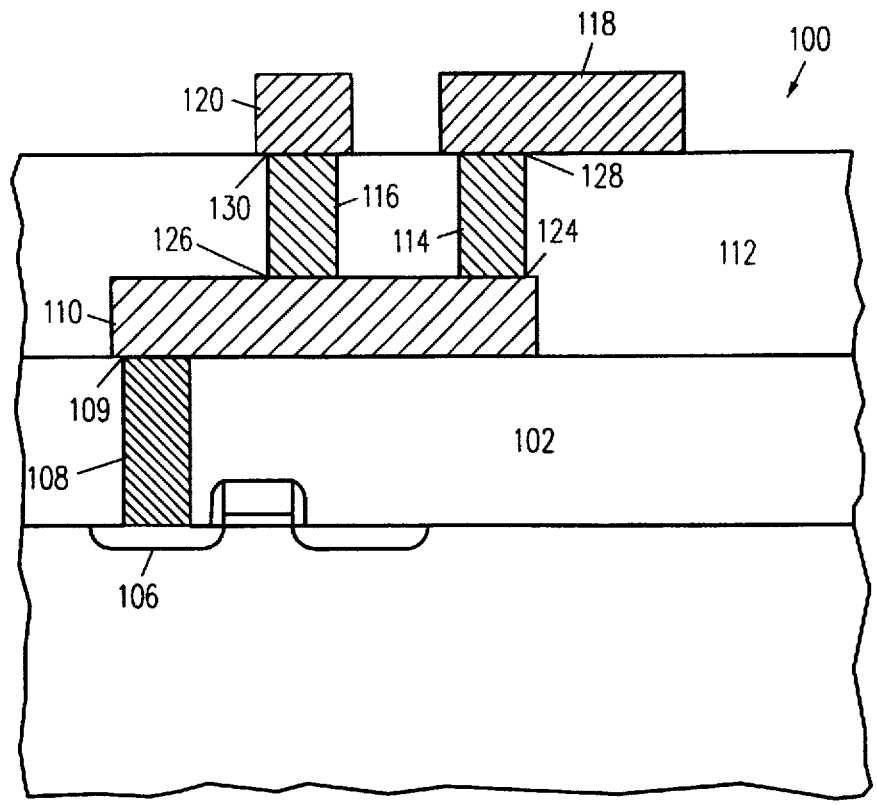
FIG. 1 illustrates a prior art multi-level interconnect structure.

As previously described, the vertical interconnects 108, 114, and 116 and horizontal interconnects 110, 118, and 120 of the conventional multi-level interconnect structure form horizontal contact interfaces as shown in FIG. 1. From FIG. 10, the multi-level interconnect structure 200 provides vertical contact interfaces between the vertical interconnects 210, 222, and 224 and the horizontal interconnects 211, 217, and 219.

Figure 16:
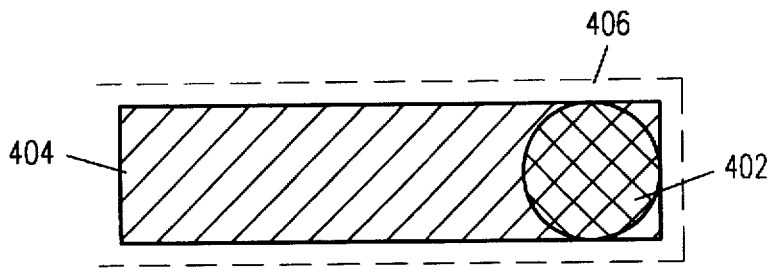
FIG. 16 illustrates a top view of a prior art aligned horizontal contact interface.
Figure 17:
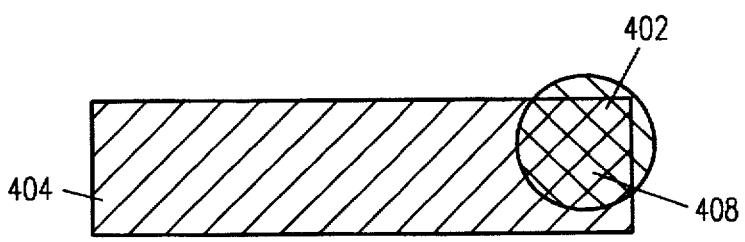
FIG. 17 illustrates a top view of a prior art misaligned horizontal contact interface.
Figure 18:
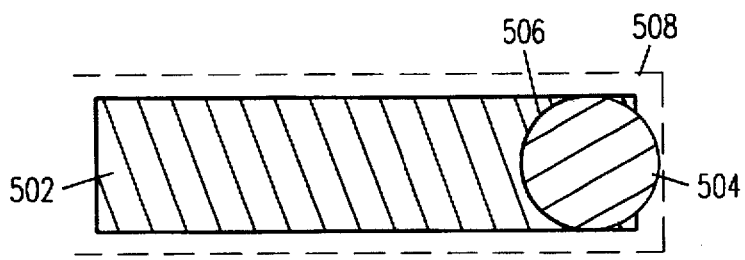
FIG. 18 illustrates a top view of an aligned vertical contact interface.

Referring to FIG. 18, a top view of a horizontal interconnect 502 and a vertical interconnect 504 is shown. The vertical contact interface 506 represents a top view of the vertical contact interfaces 212, 226, 227, 228, 229, 230, 231, and 232 as shown in FIG. 10. From FIGS. 10 and 18, the size of the vertical contact interface 506 may be expressed by Equation [4] as follows:

$$A_{vci}=(\tfrac{1}{2})\pi*t*w \quad [4]$$

where $A_{vci}$, t, and w are the size of the vertical contact interface, thickness, and linewidth of the horizontal interconnect 502, respectively. A factor of ½ is introduced because the current only passes through half of the cylindrical interface 506 at any one time. Equation [4] illustrates that $A_{vci}$ is defined by t and w and is dependent on the thickness and linewidth of horizontal interconnect 502. A comparison of Equation [4] to Equation [1] indicates that when horizontal interconnect thickness remains constant, corresponding reductions in linewidth result in a vertical contact interface size 506, FIG. 18, which is larger than a conventional horizontal contact interface size 402, FIG. 16.

Figure 20:
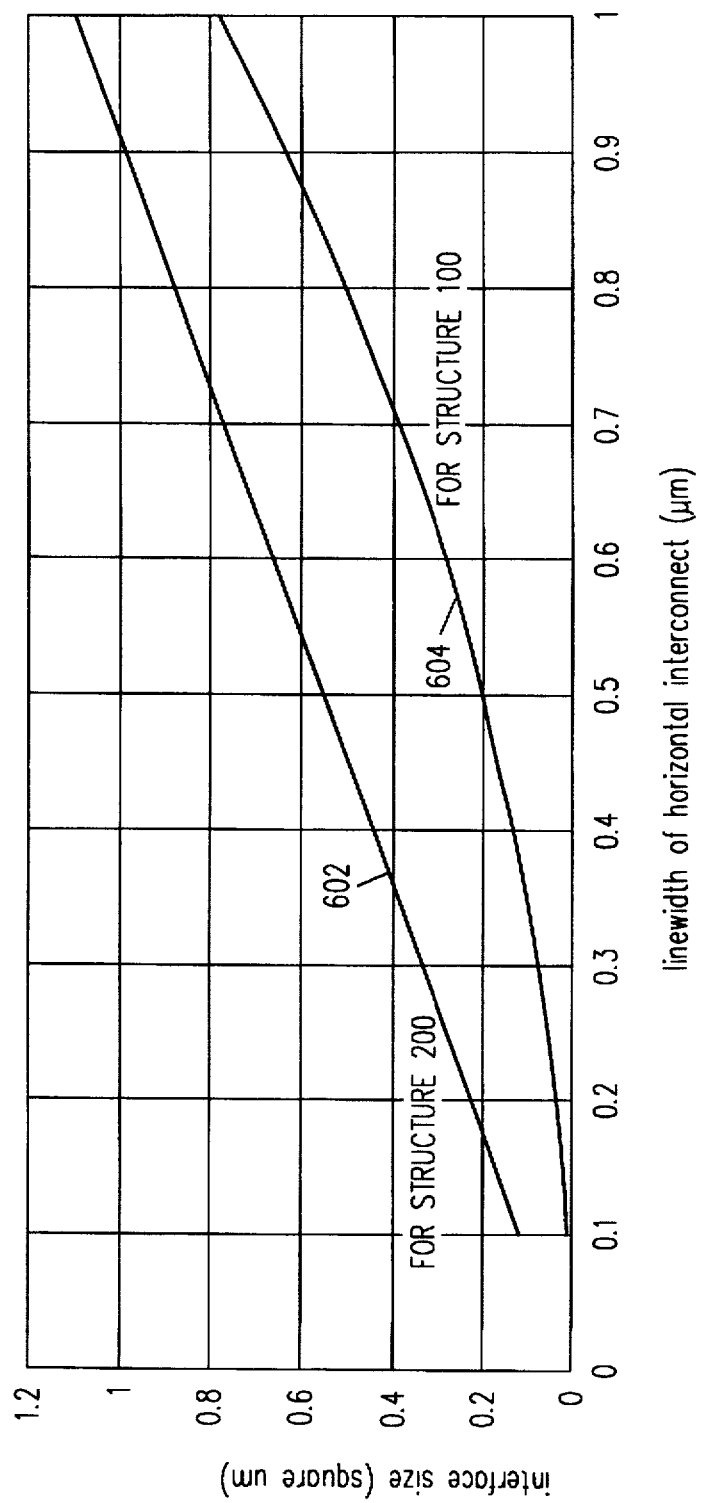
FIG. 20 illustrates the relationship between linewidth and interface size of a vertical interface structure and a horizontal interface structure.

FIG. 20 provides a graphical comparison, using Equations [1] and [4], of the size of a contact interface between a vertical interconnect and a horizontal interconnect versus the linewidth of a horizontal interconnect for t equal 0.7 μm. Lines 602 and 604 correspond to the multi-level interconnect structure 200 and the conventional multi-level interconnect structure 100, respectively. Note that the size of the vertical contact interface of multi-level interconnect structure 200 is always greater than the size of a horizontal contact interface of multi-level interconnect structure 100 for sub-micron linewidths greater than 0 and t equal 0.7 μm. The size of the vertical contact interfaces 212, 226, 227, 228, 229, 230, 231, and 232 is greater than the size of a horizontal contact interfaces 109, 126, 124, 128, and 130 for linewidths of other thicknesses as long as the thickness is more than half of the linewidth (which is the case in advanced processes) in accordance with Equations [1] and [4].

Equation [5] represents the ratio of the size of the vertical contact interface to the size of the conventional horizontal contact interface as follows:

$$R=A_{vci}/A_{hci}=2*t/w \quad [5]$$

where R is the ratio between $A_{vci}/A_{hci}$ and $A_{vci}$, $A_{hci}$, t and w are the same variables present in Equation [4]. Equation [5] is obtained by dividing Equation [1] by Equation [4].

Figure 21:
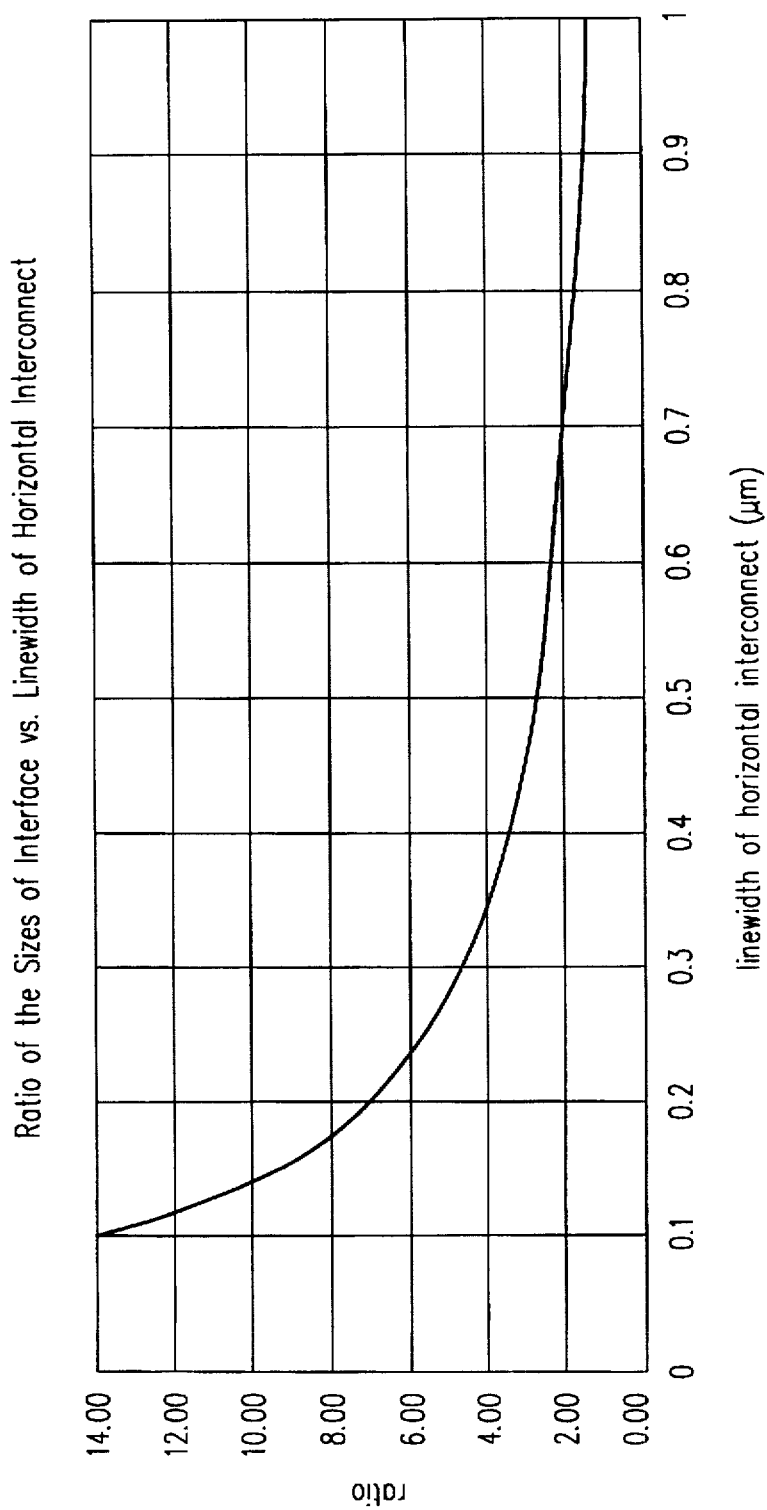
FIG. 21 illustrates the relationship between linewidth and the ratio of the interface size of a vertical interface structure to a horizontal interface structure.

FIG. 21 illustrates a graphical plot of Equation [5] for t equal 0.7 μm, where the y-axis represents R and the x-axis represents w. FIG. 21 clearly illustrates the increasing disparity-between the size of the vertical contact interface, e.g. vertical contact interface 212, and the size of the horizontal contact interface in accordance with conventional multi-level interconnect structures as the linewidth of the horizontal interconnects decrease.

Referring to Equation [3], it is apparent that an increase in the size of a contact interface results in a decrease in current density for a constant current flow. Referring now to Equation [2], it is apparent that when the current density decreases, all other variables remaining constant, the electromigration lifetime of a contact interface increases, which is a desirable characteristic. As indicated by Equation [5], when t is greater than one half of w, R is greater than 1. When R is greater than 1, the electromigration lifetime of the vertical contact interface exceeds that of the conventional horizontal contact interface assuming the utilization of the same material(s) for the vertical interconnect(s) and the same material(s) for the horizontal interconnect(s). At present the ratio R is about 2 for the most advanced production technologies. Furthermore, when dividing Equation [2], using the size of the vertical contact interface, by Equation [1], using the size of the conventional horizontal contact interface, a ratio of the electromigration lifetime of the vertical contact interface to the electromigration lifetime of the conventional horizontal contact interface is obtained. Equation [6] expresses this ratio as follows:

$$R_{Tem} = (2 * t/w)n \qquad [6]$$

where $R_{Tem}$ represents a ratio of the electromigration lifetime of the vertical contact interface to the electromigration lifetime of the conventional horizontal contact interface, where t and w are the same variables a present in Equation [4], and n is the same variable present in Equation [2].

Figure 22:
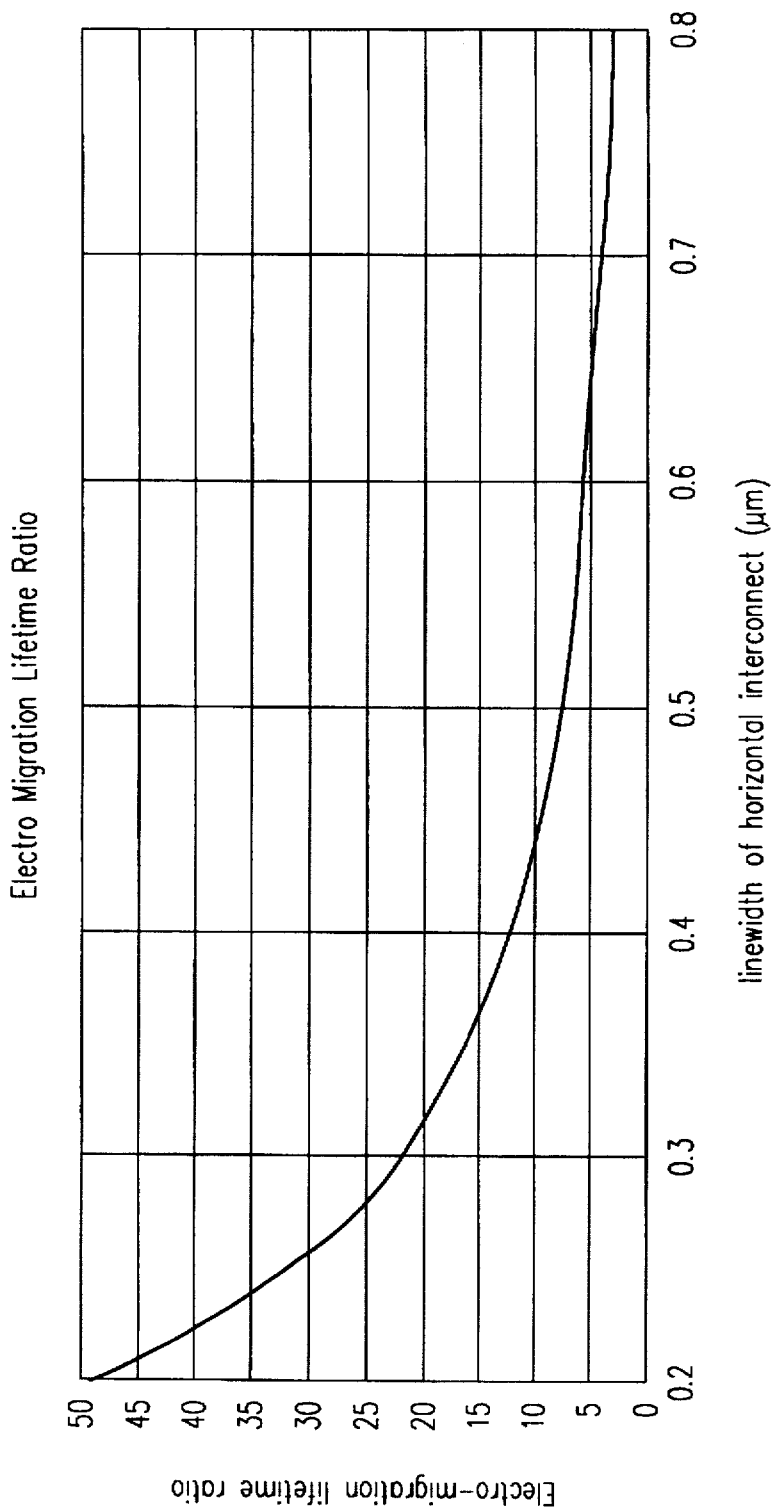
FIG. 22 illustrates the relationship between linewidth and the ratio of the electromigration lifetimes of a vertical interface structure to a horizontal interface structure.

FIG. 22 illustrates the electromigration lifetime ratio, $R_{Tem}$, versus the linewidth of a horizontal interconnect assuming a 0.7 µm horizontal interconnect thickness and n=2, a conservative estimate of the current-density dependent exponent. An inspection of FIG. 22 reveals that as the linewidth of a horizontal interconnect decreases in accordance with fabrication technology advancements, the electromigration lifetime ratio $R_{Tem}$ increases. At a linewidth of 0.2 µm, the electromigration lifetime of the vertical contact interface is approximately 49 times longer than the horizontal contact interface of the conventional multi-level interconnect structure. Recalling that the contact interface whether vertical or horizontal is the limiting factor with regard to electromigration lifetime, the information conveyed by FIG. 22 demonstrates an advantage of the multi-level interconnect structure 200.

The increase of electromigration lifetime of the multi-level interconnect structure 200 directly relates to an increased reliability of the multi-level interconnect structure. Moreover, when the size of the vertical contact interface exceeds that of the conventional horizontal contact interface, i.e. R is greater than one in Equation [5], the current, I in Equation [3], is greater for the multi-level interconnect structure 200 than for the conventional multi-level interconnect structure when the current densities are the same. Because greater current translates into increased integrated circuit speed performance, the multi-level interconnect structure 200 enhances integrated circuit speed performance without compromising reliability.

Furthermore when R in Equation [5] is greater than 1, Equation [3] infers that, for a given current, I, the current density, J, at the vertical contact interface, is lower than the current density, J, at the horizontal contact interface of the conventional multi-level interconnect structure.

Additionally, under these conditions $R_{Tem}$ of Equation [6] is greater than one indicating the electromigration lifetime of the multi-level interconnect structure 200 exceeds that of the conventional multi-level interconnect structure. Therefore, the multi-level interconnect structure 200 can also enhance the multi-level interconnect structure reliability without compromise on integrated circuit speed performance.

Figure 19:
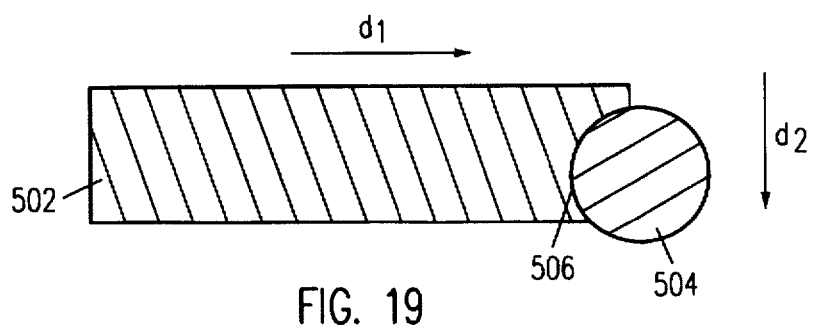
FIG. 19 illustrates a top view of a misaligned vertical contact interface.

In addition to the advantages of potentially greater electromigration lifetimes, the multi-level interconnect structure 200 is essentially misalignment free in the direction of the horizontal interconnect. Moreover, the multi-level interconnect structure 200 provides a larger contact interface size for misalignment in the direction perpendicular to the horizontal interconnect than a corresponding misalignment of the conventional horizontal contact interface. Referring to FIG. 18, a horizontal interconnect 502, a contact/via 504 and a vertical contact interface 506 are illustrated. The horizontal interconnect 502 and contact/via 504 are shown in perfect alignment. Referring to FIG. 19, the horizontal interconnect 502 and contact/via 504 are shown to be displaced in the direction, $d_1$, of the horizontal interconnect 502 and misaligned in the direction, $d_2$, perpendicular to the direction of the horizontal interconnect 502. The interconnect structure of FIG. 19 allows a displacement and an etch process tolerance during horizontal interconnect 502 masking as much as half of the radius of contact/via 504 in the $d_1$ direction without a reduction of effective conducting vertical contact interface size since current in FIG. 18 only passes through approximately half of the vertical contact interface 506 at any one time. Normally, the radius of a contact/via is several times as much as the maximum masking misalignment and etch process tolerance. Therefore, any normal tolerance misalignment error still renders the entire current carrying portion of contact/via 504 in contact with horizontal interconnect 502. No increase in current density results. Correspondingly and in contrast with conventional interconnect structure discussed above, there is no reduction in electromigration lifetimes as a result of normal displacement in the $d_1$ direction. When a misalignment occurs in the $d_2$ direction, the reduction of the size of the vertical contact interface 506 follows Equation [4] and is relatively less than that of the conventional architecture which reduces in accordance with Equation [1]. Therefore in accordance with Equation [2], any reduction in the electromigration lifetime of the interconnect structure will be relatively less than that of the conventional interconnect structure.

Figure 24:
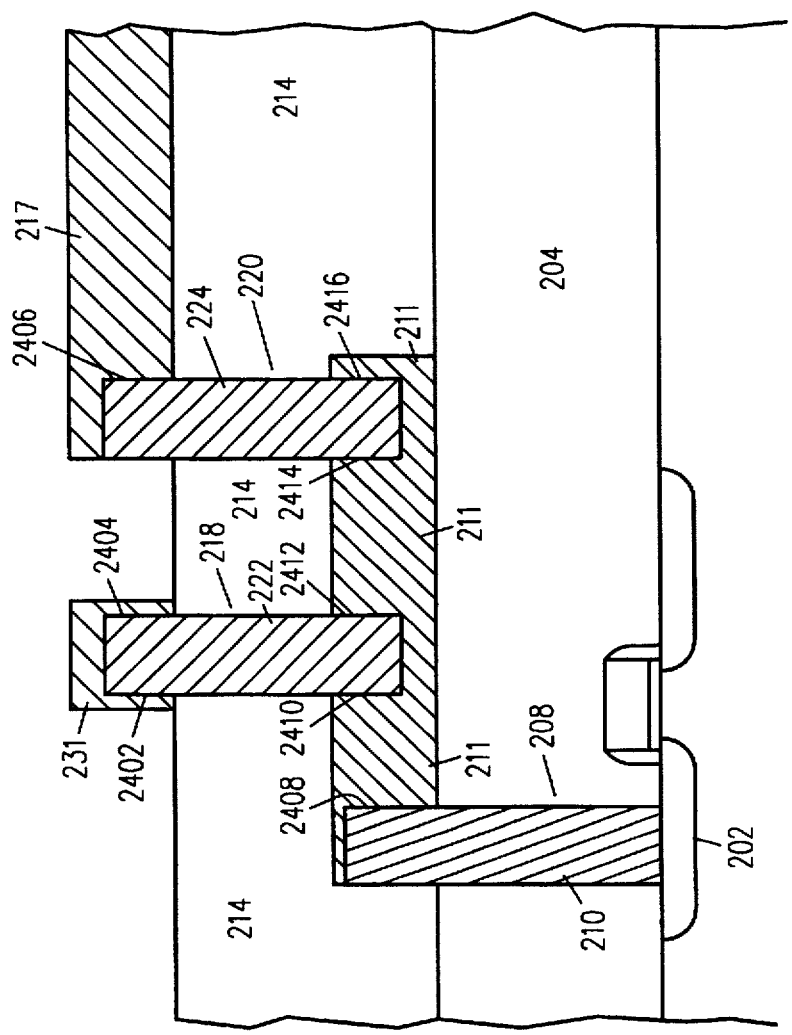
FIG. 24 illustrates a cross sectional representation of an alternative multi-level interconnect structure having contact interfaces that intrude only partially into horizontal interconnects.

Although vertical interconnects with a cylindrical geometry and vertical interfaces have been illustrated, it will be appreciated that cylindrical and other vertical interconnect geometries with vertical and non-vertical interface geometries may be utilized to achieve the advantages described herein. Cylindrical and other vertical interconnect geometries such as elliptical, trapezoidal, conical, and rectangular vertical interconnects may be used to form contact interface geometries that intrude only partially into the horizontal interconnect, or terminate a horizontal interconnect and/or contact a horizontal interconnect interface surface(s) defined by the thickness and linewidth of the horizontal interconnect. FIG. 24 illustrates a cross sectional representation of an alternative multi-level interconnect structure having vertical contact interfaces 2402–2416 that intrude only partially into horizontal interconnects.

It will be appreciated that process parameters such as chemical reactants, pressures, and temperatures are provided but other parameters may also be used. Accordingly, various other embodiments and modifications and improvements not described herein may be within the spirit and scope of the present invention, as defined by the following claims.

What is claimed is:

1. A process comprising the steps of:
   forming an electrically conductive region;
   forming a first dielectric layer on the electrically conductive layer;
   forming a first metallic layer on the first dielectric layer;
   removing a first portion of the first metallic layer to form a first opening in the first metallic layer;
   removing a portion of the first dielectric layer through the opening in the first metallic layer to form an opening in the first dielectric layer;
   forming a second metallic layer to fill the first opening in the first metallic layer and the opening in the first dielectric layer, wherein a first vertical interface is formed between the first metallic layer and the second metallic layer;
   forming a second dielectric layer disposed over the first metallic layer and over the second metallic layer;
   forming a third metallic layer on the second dielectric layer;
   removing a portion of the third metallic layer to form an opening in the third metallic layer;
   removing a portion of the second dielectric layer through the opening in the third metallic layer to form an opening in the second dielectric layer;
   removing a second portion of the first metallic layer through the openings in the third metallic layer and the second dielectric layer to form a second opening in the first metallic layer terminating at the first dielectric layer; and
   forming a fourth metallic layer to fill the second opening in the first metallic layer, the opening in the third metallic layer, and the opening in the second dielectric layer, wherein a second vertical interface is formed between the first metallic layer and an end region of the fourth metallic layer, and a third vertical interface is formed between the third metallic layer and the other end region of the fourth metallic layer.

2. The process of claim 1 wherein the step of forming a first metallic layer comprises the step of:
   depositing the first metallic layer;
   wherein the step of forming a second metallic layer comprises the step of:
   depositing a second metallic layer; wherein the step of forming a third metallic layer comprises the step of:
   depositing a third metallic layer; and wherein the step of forming a fourth metallic layer comprises the step of:
   depositing a fourth metallic layer.

3. The process of claim 1 wherein the step of removing a portion of the first metallic layer to form a first opening comprises the step of:
   etching the first metallic layer to form a first opening;
   wherein the step of removing a portion of the first dielectric layer comprises the step of:
   etching the first dielectric layer;
   wherein removing a portion of the electrically conductive layer comprises the step of:
   etching electrically conductive layer;
   wherein removing a portion of the third metallic layer comprises the step of:
   etching third metallic layer;
   wherein removing a portion of the second dielectric layer comprises the step of:
   etching the second dielectric layer; and
   wherein removing a portion of the first metallic layer through the openings in the third metallic layer and the second dielectric layer comprises the step of:
   etching the first metallic layer through the openings in the third metallic layer and the second dielectric layer.

4. A process as in claim 1, further comprising the steps of:
   forming a mask having an opening to the first metallic layer, wherein the step of removing a portion of the first metallic layer to form a first opening in the first metallic layer comprises etching the first metallic layer through the mask having an opening to the first metallic layer;
   removing the mask having an opening to the first metallic layer; and
   forming a mask having an opening to the third metallic layer, wherein the step of removing a portion of the third metallic layer comprises etching the third metallic layer through the mask having an opening to the third metallic layer.

5. The process as in claim 1 wherein a substantially vertical interface exists between the first and second metallic layers, a substantially vertical interface exists between the first and fourth metallic layers, and a substantially vertical interface exists between the third and fourth metallic layers.

6. The process as in claim 1 wherein a top surface of the first metallic layer substantially coincides with a top surface of the second metallic layer.

7. The process as in claim 1 wherein the first metallic layer comprises a Titanium/Titanium Nitride/Aluminum-Copper alloy/Titanium Nitride stack, and wherein the second metallic layer comprises a Titanium/Titanium Nitride layer stack and Tungsten.

8. The process as in claim 1 wherein a top surface of the third metallic layer substantially coincides with a top surface of the fourth metallic layer.

9. The process as in claim 1 wherein the third metallic layer comprises a Titanium/Titanium Nitride/Aluminum-Copper alloy/Titanium Nitride stack, and wherein the fourth metallic layer comprises a Titanium/Titanium Nitride layer stack and Tungsten.

10. The process as in claim 1 further comprising the steps of:
    patterning the first metallic layer into a horizontal interconnect;
    patterning the third metallic layer into a horizontal interconnect;
    forming the second metallic layer into a vertical interconnect; and
    forming the fourth metallic layer into a vertical interconnect.

11. The process as in claim 1 wherein an interface between the first and second metallic layers has a size dependent in part on a linewidth of the first metallic layer and a thickness of the first metallic layer, wherein an interface between the first and fourth metallic layers has a size dependent in part on a linewidth of the first metallic layer and a thickness of the first metallic layer; and wherein an interface between the third and fourth metallic layers has a size dependent in part on a linewidth of the third metallic layer and a thickness of the third metallic layer.

12. A process comprising the steps of:
    forming a first conductor, of thickness t and linewidth w, the first conductor having a first portion and a second portion;
    forming a dielectric layer on the first conductor;

forming an opening through the dielectric layer;

forming an opening in the first conductor, the first conductor opening being in communication with the dielectric layer opening; and forming a second, approximately vertical, conductor in the first conductor opening and the dielectric layer opening, the second conductor having a thickness greater than t and coupled to the first conductor first portion at a first interface and coupled to the first conductor second portion at a second interface, wherein the first and second interfaces are of approximately equal size, and the size of the first interface substantially exceeds ½ times π times $w^2$ to increase the electromigration lifetime of the first interface.

13. The process as in claim 12 wherein the first conductor forming step comprises:

forming the first conductor of a Titanium/Titanium Nitride/Aluminum-Copper alloy/Titanium Nitride stack; and wherein the second conductor forming step comprises:
forming the second conductor of a Titanium/Titanium Nitride layer stack and Tungsten.

14. The process as in claim 12 wherein the thickness t of the first conductor exceeds the width w of the first conductor by a factor of at least 1.5.

15. The process as in claim 12 wherein the thickness t of the first conductor exceeds the width w of the first conductor by a factor of at least 2.

16. The process as in claim 12 wherein the thickness t of the first conductor exceeds the width w of the first conductor by a factor of at least 3.

17. The process as in claim 12 wherein the thickness t of the first conductor exceeds the width w of the first conductor by a factor of at least 4.

18. The process as in claim 12, wherein the first conductor also includes third and fourth portions, the process further comprising the steps of:

forming a second dielectric layer on the first conductor;

forming a third conductor, of thickness $t_2$ and a linewidth $w^2$, on the second dielectric, the third conductor having a first portion and a second potion;

forming an opening in the third conductor;

forming an opening through the second dielectric layer;

forming a second opening in the first conductor, the third conductor opening, the second dielectric layer opening, and the second opening in the first conductor being in communication with each other; and forming a fourth, approximately vertical, conductor in the third conductor opening, the second dielectric layer opening, and the second opening in the first conductor, the fourth conductor having a thickness greater than t plus $t_2$ and coupled to the third conductor first portion at a first interface, coupled to the third conductor second portion at a second interface, coupled to the first conductor third portion at a third interface, and coupled to the first conductor fourth portion at a fourth interface, wherein the first and second interfaces coupling the third and fourth conductors are of approximately equal size, and the size of the first interface coupling the third and fourth conductors substantially exceeds ½ times π times $w_2^2$, and wherein the third and fourth interfaces coupling the first and fourth conductors are of approximately equal size, and the size of the third interface substantially exceeds ½ times π times $w^2$.

19. The process as in claim 18 wherein the thickness $t_2$ of the third conductor exceeds the width $w_2$ of the third conductor by a factor of at least 2.

20. A method of fabricating an integrated circuit comprising the steps of:

forming a circuit device region in a wafer;

forming a contact dielectric over the circuit device region;

forming a first interconnect layer on the contact dielectric over the circuit device region;

opening a contact hole through a first portion of the first interconnect layer and the contact dielectric to the circuit device region;

forming a contact interconnect in the contact hole, the first interconnect having a first approximately vertical interface with the first interconnect layer;

forming a via dielectric over the first interconnect layer and the contact interconnect;

forming a second interconnect layer on the via dielectric;

opening a first via hole through a first portion of the second interconnect layer, through a first portion of the via dielectric, and at least substantially through a second portion of the first interconnect layer, wherein the first via hole terminates near an intersection of the first interconnect layer and the contact dielectric proximate to the first via hole;

forming a first via interconnect in the first via hole, wherein a second approximately vertical interface is formed between the second interconnect layer and an end region of the first via interconnect, and a third approximately vertical interface is formed between the first interconnect layer and the other end region of the first via interconnect;

forming a second via hole through a second portion of the second interconnect layer, through a second portion of the via dielectric, and at least substantially through a third portion of the first interconnect layer, wherein the second via hole terminates near an intersection of the first interconnect layer and the contact dielectric proximate to the second via hole; and forming a second via interconnect in the second via hole, wherein a fourth approximately vertical interface is formed between the fourth interconnect layer and an end region of the second via interconnect, and a fifth approximately vertical interface is formed between the first interconnect layer and the other end region of the second via interconnect.

21. The method as in claim 20 further comprising the step of:

separating the first portion of the second interconnect layer from the second portion of the second interconnect layer.

22. The method as in claim 20 wherein the step of forming the first interconnect layer comprises the step of:

depositing a multiple layered stack on a surface of the contact dielectric; and wherein the step of forming the second interconnect layer comprises the step of:

depositing a multiple layered stack on a surface of the via dielectric.

23. The method as in claim 22 wherein the contact dielectric and via dielectric are silicon dioxide, the first and second interconnect layers include a metal selected from the group consisting of aluminum and copper, and the contact interconnect and the first and second via interconnects include tungsten.

24. The method as in claim 20 wherein the step of forming the contact interconnect comprises the steps of:

lining the contact hole with a conductive adhesion layer; and filling the lined contact hole with a conductive material; and wherein the step of forming the first via interconnect comprises the steps of:

lining the first via hole with a conductive adhesion layer; and filling the lined first via hole with a conductive material; and wherein the step of forming the second via interconnect comprises the steps of:

lining the second via hole with a conductive adhesion layer; and filling the lined second via hole with a conductive material.

* * * * *